United States Patent
Urabe et al.

(10) Patent No.: US 8,013,626 B2
(45) Date of Patent: Sep. 6, 2011

(54) TEST APPARATUS AND DRIVER CIRCUIT

(75) Inventors: Yasuhiro Urabe, Gunma (JP); Naoki Matsumoto, Saitama (JP); Yuji Kuwana, Gunma (JP)

(73) Assignee: Advantest Corporation, Tokyo (JP)

( * ) Notice: Subject to any disclaimer, the term of this patent is extended or adjusted under 35 U.S.C. 154(b) by 373 days.

(21) Appl. No.: 12/414,681

(22) Filed: Mar. 31, 2009

(65) Prior Publication Data
US 2010/0244884 A1    Sep. 30, 2010

(51) Int. Cl.
*G01R 31/02* (2006.01)
*G01R 31/26* (2006.01)

(52) U.S. Cl. .................................. 324/762.01

(58) Field of Classification Search .................. None
See application file for complete search history.

*Primary Examiner* — Roberto Velez
(74) *Attorney, Agent, or Firm* — Jianq Chyun IP Office

(57) ABSTRACT

Provided is a test apparatus that tests a device under test, comprising a driver circuit that generates an output signal according to a prescribed input pattern and supplies the output signal to the device under test; and a measuring section that judges acceptability of the device under test by measuring a response signal output by the device under test. The driver circuit includes an input terminal that receives the input pattern; a switching section that operates according to a logic value of the input pattern to generate the output signal; and an emphasized component generating section that is provided between the input terminal and the switching section, and that (i) generates an emphasized component according to a prescribed high frequency component of the input pattern and (ii) superimposes the emphasized component onto a voltage supplied to the switching section.

15 Claims, 11 Drawing Sheets

TEST APPARATUS AND DRIVER CIRCUIT

BACKGROUND

1. Technical Field

The present invention relates to a test apparatus and a driver circuit.

2. Related Art

A semiconductor test apparatus outputs, to a device under test, an output signal for testing that is generated based on a prescribed input pattern. The semiconductor test apparatus switches the voltage of the output signal according to the input pattern by using a transistor or an analog switch to switch the output voltage.

The semiconductor test apparatus is connected to the device under test via a transmission line. A high frequency component of the signal output by the semiconductor test apparatus is attenuated due to the impedance of the transmission line. As a result, the rising waveforms and falling waveforms of the output signal are undesirably rounded.

SUMMARY

Therefore, it is an object of an aspect of the innovations herein to provide a test apparatus and a driver circuit, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a driver circuit that generates an output signal according to a prescribed input pattern and supplies the output signal to the device under test; and a measuring section that judges acceptability of the device under test by measuring a response signal output by the device under test. The driver circuit includes an input terminal that receives the input pattern; a switching section that operates according to a logic value of the input pattern to generate the output signal; and an emphasized component generating section that is provided between the input terminal and the switching section, and that (i) generates an emphasized component according to a prescribed high frequency component of the input pattern and (ii) superimposes the emphasized component onto a voltage supplied to the switching section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
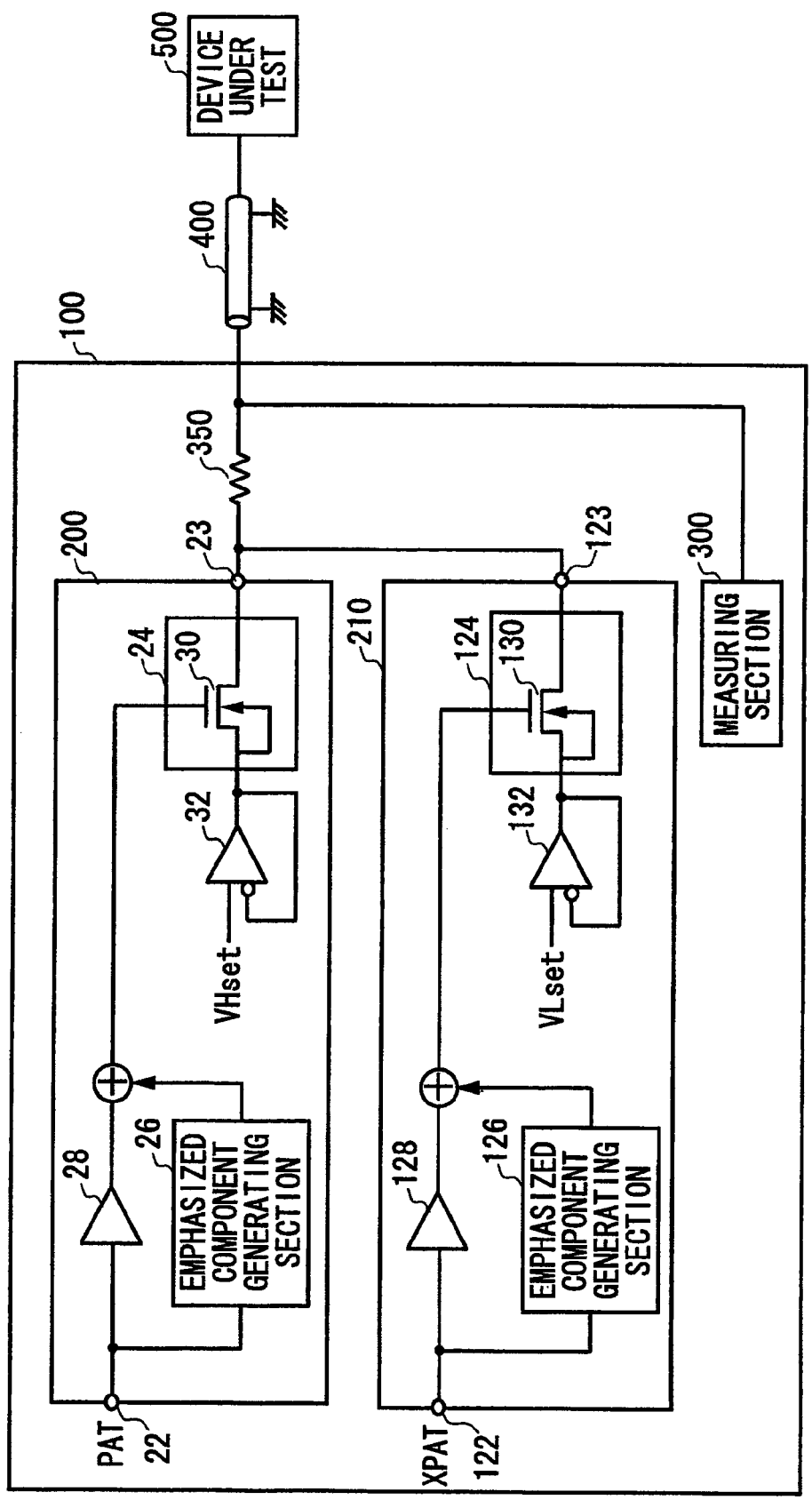
FIG. 1 shows a configuration of a test apparatus 100 according to an embodiment of the present invention.

FIG. 1 shows a configuration of a test apparatus 100 according to an embodiment of the present invention. The test apparatus 100 tests a device under test 500 that includes a semiconductor circuit or the like. The test apparatus 100 may be connected to the device under test 500 by a transmission line 400.

The test apparatus 100 is provided with a driver circuit 200, a driver circuit 210, a measuring section 300, and an output resistor 350. The driver circuit 200 and the driver circuit 210 may have the same configuration. The driver circuit 200 and the driver circuit 210 generate an output signal according to prescribed input patterns PAT and XPAT, and supply the output signal to the device under test 500. The measuring section 300 is connected to the line between the output resistor 350 and the transmission line 400. The measuring section 300 measures a response signal output by the device under test 500 and judges the acceptability of the device under test 500.

The test apparatus 100 outputs, to the device under test 500, an output signal output by either the driver circuit 200 or the driver circuit 210, according to the input pattern PAT and the input pattern XPAT. For example, when the input pattern PAT has a logic value of 1, the test apparatus 100 may output the output signal of the driver circuit 200 to the device under test 500. When the input pattern XPAT has a logic value of 1, the test apparatus 100 may output the output signal of the driver circuit 210 to the device under test 500.

The input pattern PAT input to the driver circuit 200 and the input pattern XPAT input to the driver circuit 210 are input patterns with logic values that are the inverse of each other. For example, when the logic value of PAT is 1, the logic value of XPAT is 0, and when the logic value of PAT is 0, the logic value of XPAT is 1.

The driver circuit 200 includes an input terminal 22 that receives the input pattern PAT, and a switching section 24 that operates according to the logic value of the input pattern PAT to generate the output signal. The switching section 24 includes a transistor 30 having a source terminal that receives a prescribed reference voltage VHset, a drain terminal that outputs an output signal, and a gate terminal that receives the input pattern. For example, the transistor 30 may switch whether the output signal corresponding to the prescribed reference voltage VHset applied to the source terminal is output from the drain terminal, according to the input pattern PAT applied to the gate terminal. The driver circuit 200 may output the output signal via the output terminal 23.

In the same way, the driver circuit 210 includes an input terminal 122 that receives the input pattern XPAT and a switching section 124 that operates according to the logic value of the input pattern XPAT to generate the output signal. The switching section 124 includes a transistor 130 having a source terminal that receives a prescribed reference voltage VLset, a drain terminal that outputs an output signal, and a gate terminal that receives the input pattern. The transistor 130 may switch whether the output signal corresponding to the prescribed reference voltage VLset applied to the source terminal is output from the drain terminal, according to the input pattern XPAT applied to the gate terminal. The driver circuit 210 may output the output signal via the output terminal 123.

When the logic value of the input pattern PAT is 1, the gate terminal of the transistor 30 is supplied with a voltage that is greater than or equal to a threshold voltage between the gate terminal and the source terminal for achieving conduction therebetween, i.e. achieving the ON state. As a result, conduction occurs between the source terminal and the drain terminal of the transistor 30, and so a voltage substantially equal to the reference voltage VHset is output from the drain terminal.

When the logic value of the input pattern PAT is 0, the gate terminal of the transistor 30 receives a voltage that enables conductance between the source terminal and the drain terminal and that is less than the threshold voltage between the gate terminal and the source terminal. As a result, there is no conduction between the source terminal and the drain terminal of the transistor 30, and so the output impedance of the transistor 30 is in a high-impedance state.

In the same way, when the logic value of the input pattern XPAT is 1, a voltage substantially equal to the reference voltage VLset is output from the drain terminal of the transistor 130. When the logic value of the input pattern XPAT is 0, the output impedance of the transistor 130 is in a high-impedance state.

The logic values of the input pattern PAT and the input pattern XPAT are the inverse of each other. The test apparatus 100 outputs, to the device under test 500, an output signal having a voltage that switches between the reference voltage VHset and the reference voltage VLset according to the input patterns PAT and XPAT.

The device under test 500 receives the output signal via the transmission line 400. The impedance of the transmission line 400 sometimes causes rounding in the output signal waveform. In order to correct this waveform rounding, the test apparatus 100 generates an output signal in which the high-band frequency component is emphasized.

For example, the test apparatus 100 can realize a high-band emphasizing circuit that emphasizes the high-band frequency component, by adding RC circuits in series or in parallel with the output resistor 350. However, since the impedance of an RC circuit changes according to the frequency, adding RC circuits in series or in parallel with the output resistor 350 causes the output impedance of the test apparatus 100 to fluctuate. As a result, the test apparatus 100 cannot achieve impedance matching with the transmission line 400. When the test apparatus 100 cannot achieve impedance matching with the transmission line 400, reflection occurs at the end of the transmission line 400 on the test apparatus 100 side, for example, which distorts the waveform.

Therefore, the driver circuit 200 of the present embodiment further includes an emphasized component generating section 26. The emphasized component generating section 26 is provided between the input terminal 22 and the switching section 24. The emphasized component generating section 26 generates an emphasized component according to a prescribed high-band component of the input pattern PAT and superimposes this emphasized component onto the voltage supplied to the switching section 24. The emphasized component generating section 26 superimposes the emphasized component on the input pattern PAT applied to the gate terminal of the transistor 30.

The driver circuit 200 can prevent the waveform rounding by increasing the voltage of a high-band component that is easily attenuated in the transmission line 400. Furthermore, since the emphasized component generating section 26 is not connected in series or in parallel with the output resistor 350, the test apparatus 100 can ensure impedance matching with the transmission line 400.

In the same way, the driver circuit 210 further includes an emphasized component generating section 126. The emphasized component generating section 126 is provided between the input terminal 122 and the switching section 124. The emphasized component generating section 126 generates an emphasized component according to a prescribed high-band component of the input pattern XPAT and superimposes this emphasized component onto the voltage supplied to the switching section 124. The emphasized component generating section 126 superimposes the emphasized component onto the input pattern XPAT applied to the gate terminal of the transistor 130.

At the rising timing of the input pattern PAT, the input pattern PAT includes a signal with a high-band frequency component. Therefore, the emphasized component generating section 26 may generate an emphasized component with different voltages according to the amount of time that has passed since the rising transition timing of the input pattern PAT. For example, at the rising timing of the input pattern PAT, the emphasized component generating section 26 may generate the emphasized component to have a maximum voltage. After a prescribed time has passed since the rising timing of the input pattern PAT, the emphasized component generating section 26 may set the voltage of the emphasized component to 0. The emphasized component generating section 26 may include an RC circuit.

The transistor 30 may be a MOSFET. The MOSFET has an ON resistance between the source terminal and the drain terminal. The ON resistance is the resistance between the source terminal and the drain terminal of the MOSFET while conduction occurs between the source terminal and the drain terminal. The ON resistance of the MOSFET is expressed as $Ron = A/(Vgs-Vth) \times Lg/Wg$. Here, A is a constant, Vgs is the voltage between the gate terminal and the source terminal, Vth is the threshold voltage between the gate terminal and the source terminal necessary for conduction to occur therebetween, Lg is the gate length, and Wg is the gate width.

The ON resistance Ron is a function of Vgs. Accordingly, with the reference voltage VHset being applied to the source terminal of the transistor 30, the driver circuit 200 can control the ON resistance by changing the voltage applied to the gate terminal of the transistor 30. For example, the driver circuit 200 can lower the ON resistance of the switching section 24 by superimposing the emphasized component generated by the emphasized component generating section 26 onto the input pattern PAT to increase the voltage between the gate terminal and the source terminal of the switching section 24.

With the reference voltage VHset being applied to the source terminal of the transistor 30, the voltage output from the drain terminal increases when the ON resistance of the transistor 30 decreases. Accordingly, the driver circuit 200 of the present embodiment can set the voltage of the output signal at prescribed timings to be greater than or equal to the reference voltage VHset. In the same way, the driver circuit 210 can set the voltage of the output signal at prescribed timings to be less than or equal to the reference voltage VLset.

The test apparatus 100 can superimpose the emphasized component onto the output signal at either (i) the timing at which the output signal changes from the reference voltage VHset to the reference voltage VLset or (ii) the timing at which the output signal changes from the reference voltage VLset to the reference voltage VHset. As a result, the device under test 500 can receive the output signal without waveform rounding, via the transmission line 400.

The driver circuit 200 may include an input buffer 28 between the input terminal 22 and the switching section 24. The emphasized component generating section 26 may supply the gate terminal of the transistor 30 with a voltage obtained by superimposing the emphasized component onto the voltage of the signal output by the input buffer 28. In the same way, the driver circuit 210 may include an input buffer 128 between the input terminal 122 and the switching section 124.

The driver circuit 200 may include a voltage follower circuit 32 that receives the reference voltage VHset and applies a voltage according to the reference voltage VHset to the source terminal of the transistor 30. In the same way, the driver circuit 210 may include a voltage follower circuit 132. By including the voltage follower circuit 32, the driver circuit 200 can decrease the output impedance of the voltage source that supplies the reference voltages VHset and VLset to the switching section 24. Therefore, even when a large output current is supplied from the switching section 24 to the device under test 500, the driver circuit 200 can prevent fluctuation of the reference voltages VHset and VLset.

Figure 2:
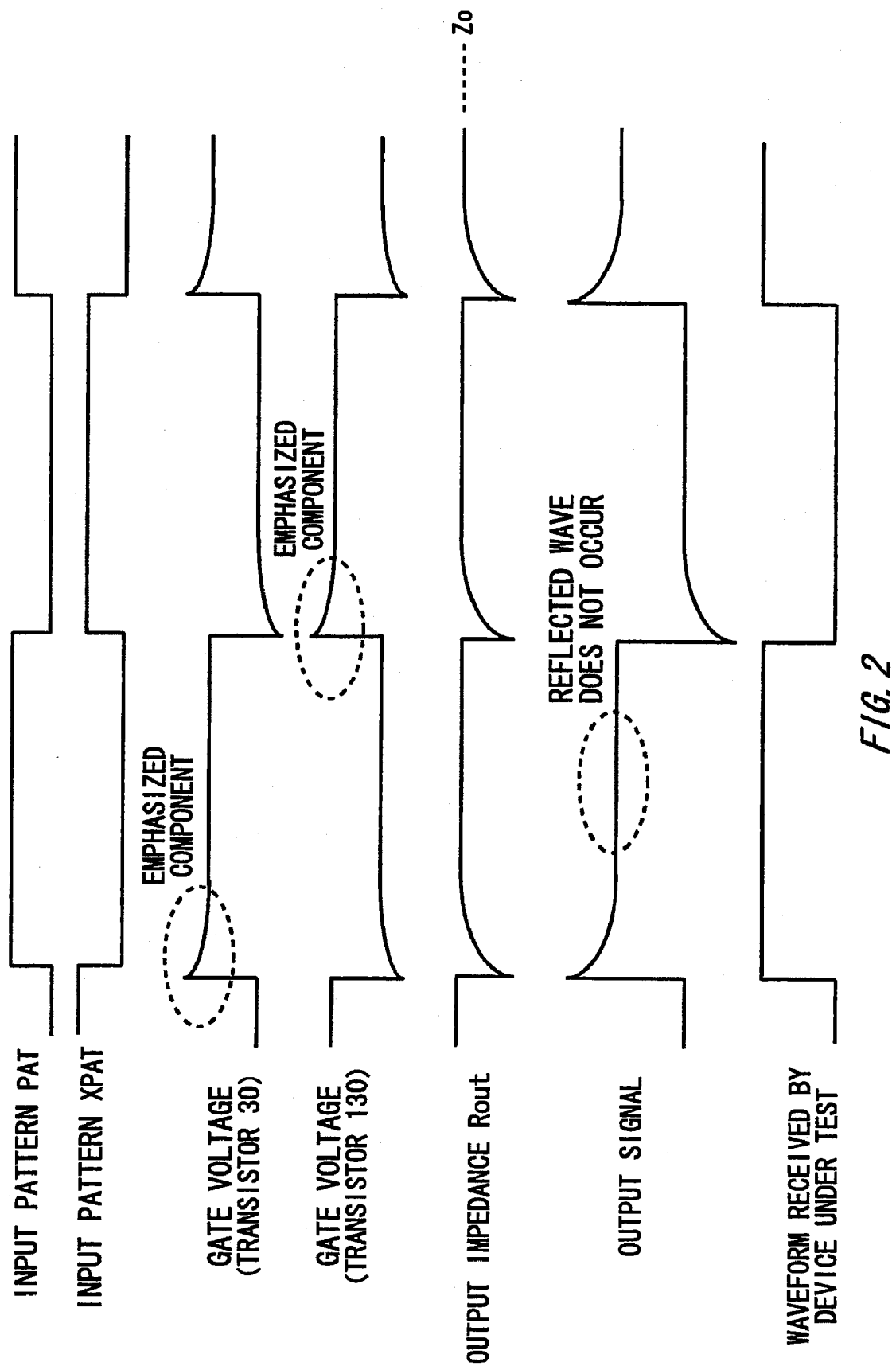
FIG. 2 shows waveforms corresponding to the input pattern PAT.

FIG. 2 shows waveforms corresponding to the input pattern PAT. The driver circuit 200 superimposes the emphasized component generated by the emphasized component generating section 26, during a prescribed period after the input pattern PAT rises. For example, if the emphasized component generating section 26 is an RC circuit, the driver circuit 200 may superimpose the emphasized component during a period corresponding to the RC time constant. Since the transistor 30 is OFF during a prescribed period after the input pattern PAT falls, the driver circuit 200 does not superimpose the emphasized component. In the same way, the emphasized component generating section 126 generates a voltage onto which the emphasized component has been superimposed during a prescribed period after the input pattern XPAT falls.

The ON resistances of the transistor 30 and the transistor 130 are lowered during the period in which the voltage onto which the emphasized component is superimposed is applied. Accordingly, during the prescribed period after the rising timings of the input pattern PAT and the input pattern XPAT, the input impedance Rout of the test apparatus 100 is less than the characteristic impedance Zo of the transmission line 400. As a result, the output signal of the test apparatus 100 has a voltage that is higher during the prescribed period after the rising timing of the input pattern PAT than during other periods. Also, the output signal has a voltage that is lower during the prescribed period after the rising timing of the input pattern XPAT than during other periods.

The output signal is transmitted on the transmission line 400, which causes attenuation of the superimposed emphasized component. As a result, the device under test 500 can receive the waveform without rounding. Furthermore, since the test apparatus 100 can ensure impedance matching with the transmission line 400, waveform distortion due to a reflected wave does not occur after a prescribed time has passed since the rising of the input pattern PAT.

Figure 3:
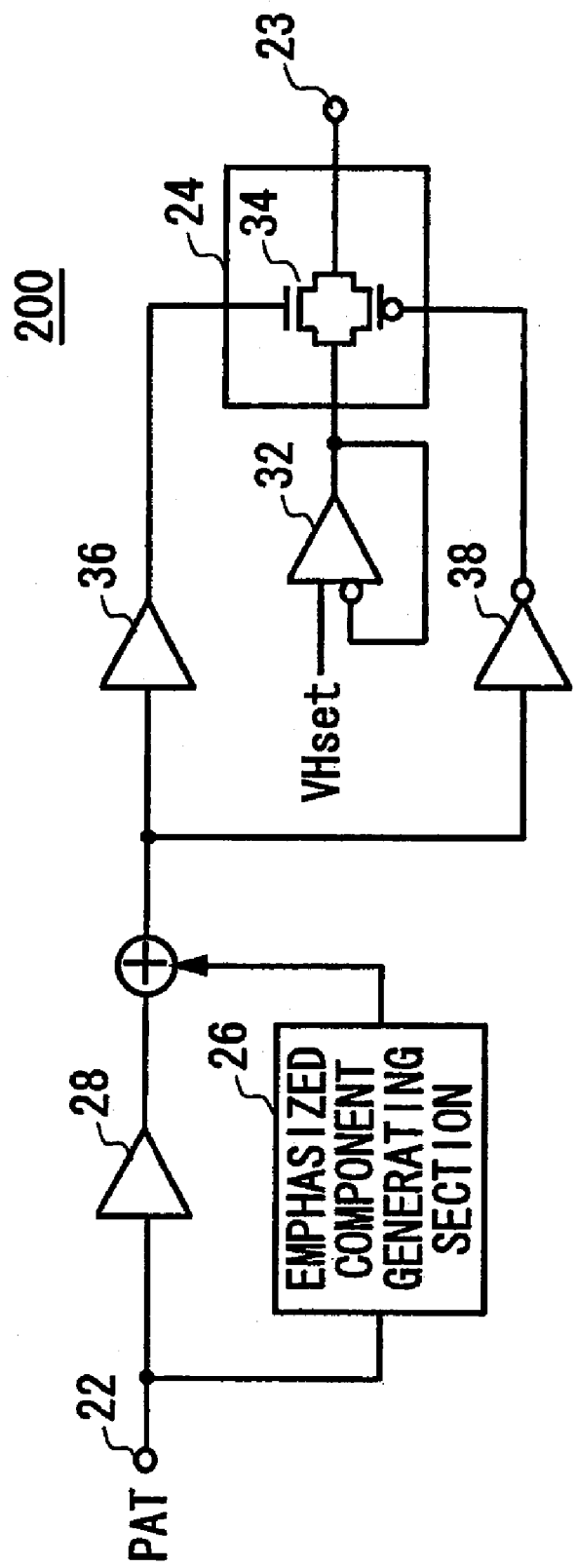
FIG. 3 shows a configuration of the driver circuit 200 according to a second embodiment.

FIG. 3 shows a configuration of the driver circuit 200 according to a second embodiment. In the present embodiment, the switching section 24 includes a CMOS transistor 34. Furthermore, the driver circuit 200 includes an n-type gate voltage output section 36 and a p-type gate voltage output section 38.

The n-type gate voltage output section 36 outputs, according to the input pattern PAT, a voltage that is applied to the gate terminal of the n-type transistor of the CMOS transistor 34. The p-type gate voltage output section 38 outputs, according to the input pattern PAT, a voltage that is applied to the gate terminal of the p-type transistor of the CMOS transistor 34.

The emphasized component generating section 26 superimposes the emphasized component onto the input pattern PAT before the input pattern PAT is input to the n-type gate voltage output section and the p-type gate voltage output section. The emphasized component generating section 26 may superimpose the emphasized component onto the input pattern PAT (i) between the n-type gate voltage output section 36 and the switching section 24 and (ii) between the p-type gate voltage output section 38 and the switching section 24.

The n-type gate voltage output section 36 applies, to the gate terminal of the n-type transistor of the CMOS transistor 34, a voltage that is higher during the period when the emphasized component is superimposed than during the period when the emphasized component is not superimposed. On the other hand, the p-type gate voltage output section 38 applies, to the gate terminal of the p-type transistor of the CMOS transistor 34, a voltage that is lower during the period when the emphasized component is superimposed than during the period when the emphasized component is not superimposed.

Accordingly, the ON resistances of the n-type and p-type transistors of the CMOS transistor 34 are lower during the period when the emphasized component is superimposed than during the period when the emphasized component is not superimposed. As a result, the driver circuit 200 can increase the voltage of the output signal during a prescribed period. For example, by applying the voltage onto which the emphasized component has been superimposed to the gate terminal of the CMOS transistor 34 at a rising timing of the input pattern PAT, the device under test 500 can receive a waveform without rounding, via the transmission line 400.

Figure 4:
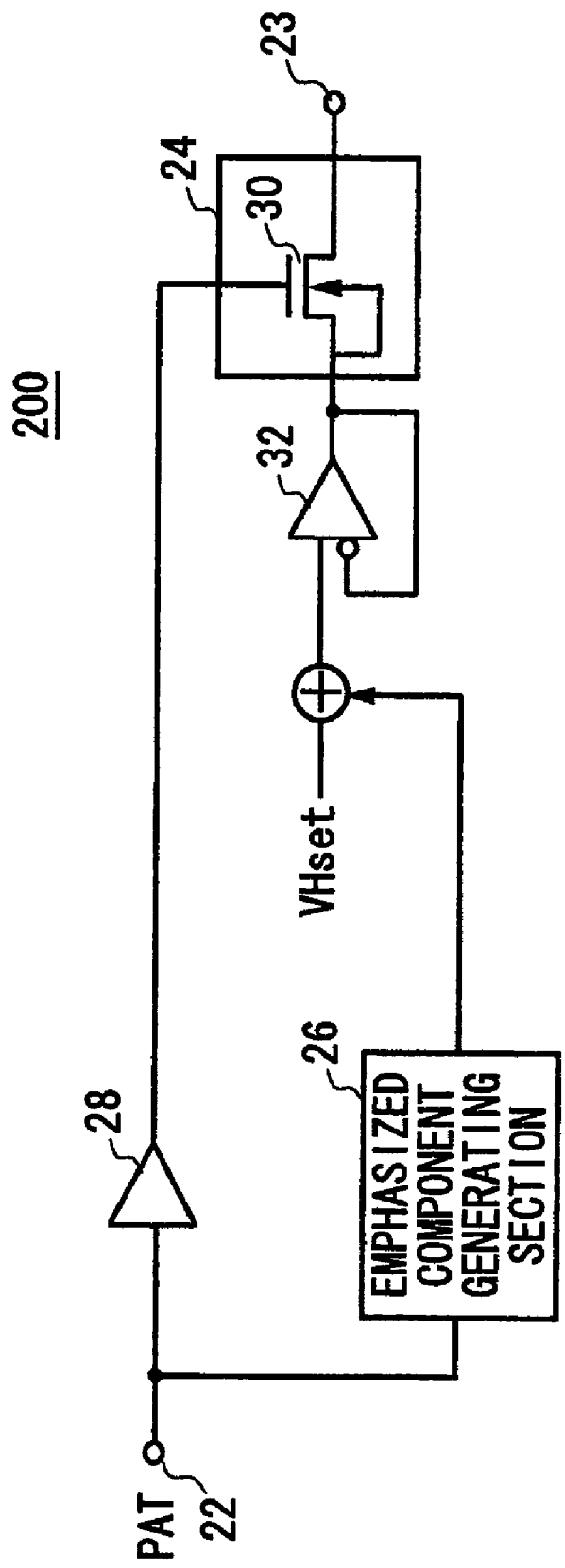
FIG. 4 shows a configuration of the driver circuit 200 according to a third embodiment.

FIG. 4 shows a configuration of the driver circuit 200 according to a third embodiment. In the present embodiment, the emphasized component generating section 26 superimposes the emphasized component onto the reference voltage VHset applied to the source terminal of the transistor 30. The emphasized component generating section 26 may superimpose the emphasized component onto either the reference voltage VHset applied to the voltage follower circuit 32 or the voltage output by the voltage follower circuit 32. While ON, the transistor 30 outputs, from the drain terminal, a voltage substantially equal to the voltage applied to the source terminal. Accordingly, the transistor 30 can output, from the drain terminal, the output signal in which the emphasized component is superimposed onto the reference voltage VHset.

In this case, the emphasized component generating section 26 superimposes the emphasized component onto the reference voltage VHset in synchronization with the timing at which conduction occurs between the source terminal and the drain terminal of the transistor 30, and so the emphasized component is superimposed within a prescribed time from the rising timing of the output signal. Therefore, the driver circuit 200 may include a delay circuit for synchronization between the input terminal 22 and the switching section 24. For example, the driver circuit may delay the signal output from the input buffer 28 by a time corresponding to the time necessary for the emphasized component generating section 26 to generate the emphasized component, and may then apply the delayed signal to the gate terminal of the transistor 30. The driver circuit 210 may have the same configuration, and the emphasized component generating section 126 may superimpose the emphasized component onto the reference voltage VLset applied to the source terminal of the transistor 130.

Figure 5:
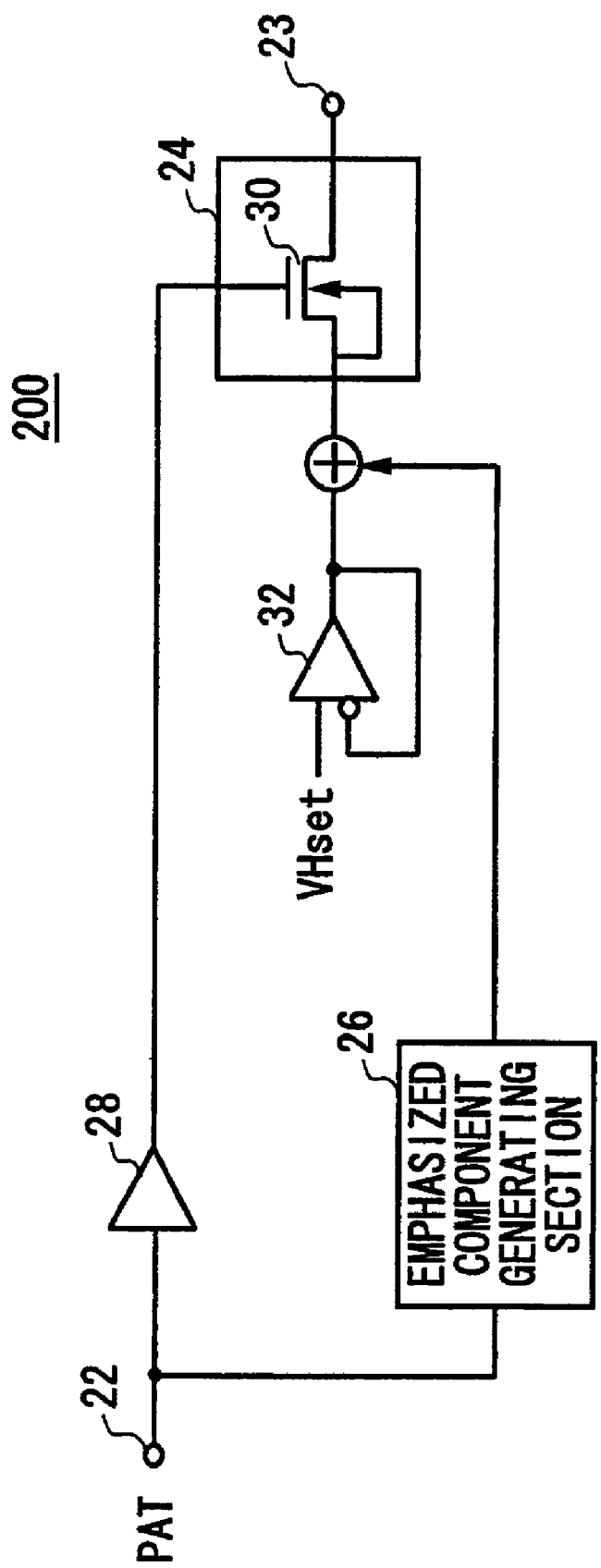
FIG. 5 shows a configuration of the driver circuit 200 according to a fourth embodiment.

FIG. 5 shows a configuration of the driver circuit 200 according to a fourth embodiment. In the present embodiment, the emphasized component generating section 26 may superimpose the emphasized component onto the reference voltage VHset generated by the voltage follower circuit 32, between the switching section 24 and the source terminal of the voltage follower circuit 32. In the same way as the third embodiment, while ON, the transistor 30 can output, from the drain terminal, the output signal in which the emphasized component is superimposed onto the reference voltage VHset.

The driver circuit 210 may have the same configuration. The emphasized component generating section 126 may superimpose the emphasized component onto the reference voltage VLset output by the voltage follower circuit 132, between the switching section 124 and the source terminal of the voltage follower circuit 132.

Figure 6:
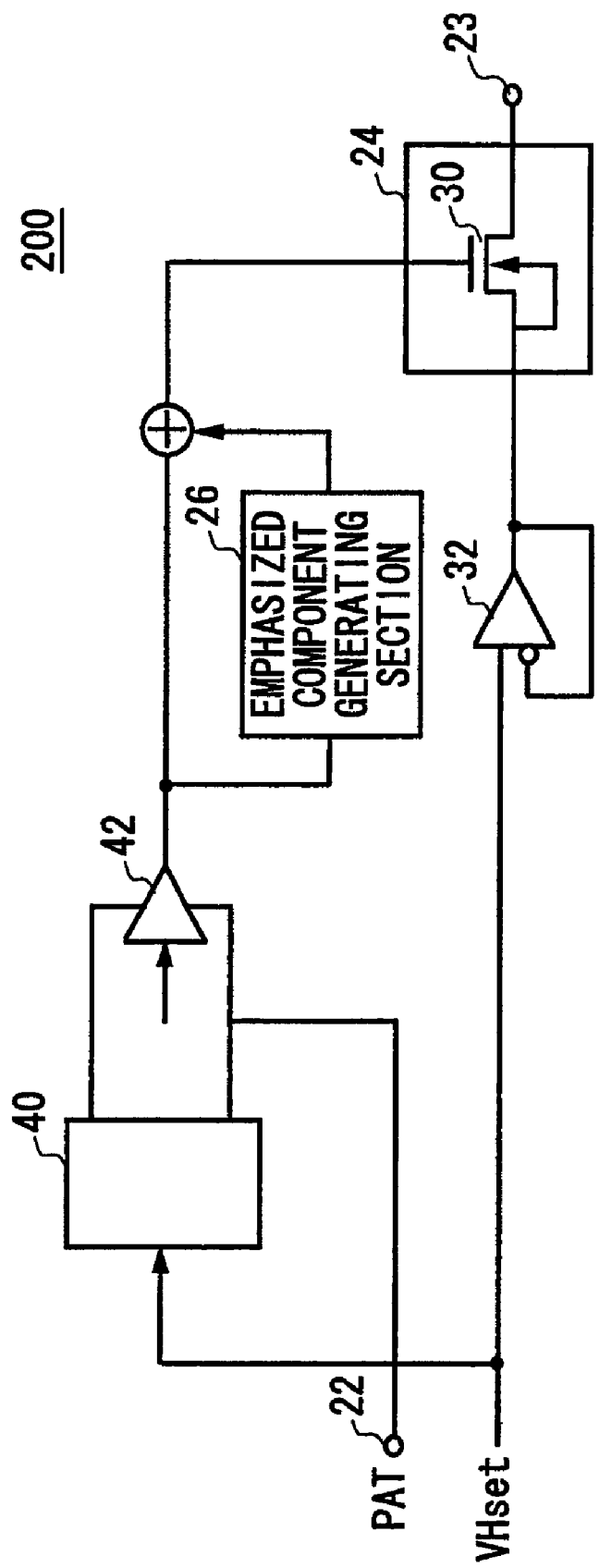
FIG. 6 shows a configuration of the driver circuit 200 according to a fifth embodiment.

FIG. 6 shows a configuration of the driver circuit 200 according to a fifth embodiment. In the present embodiment, the driver circuit 200 further includes an input drive voltage supplying section 40 and an input gate drive section 42. The input drive voltage supplying section 40 generates input drive voltages corresponding to the reference voltage VHset applied to the source terminal of the transistor 30, and supplies the input drive voltages to the input gate drive section. The input gate drive section 42 selects one of a plurality of the input drive voltages, according to the logic value of the input pattern PAT, and supplies the selected voltage to the gate terminal of the transistor 30. The emphasized component generating section 26 superimposes the emphasized component onto the voltage output by the input gate drive section 42. In the same way, the driver circuit 210 may include an input drive voltage supplying section and an input gate drive section.

More specifically, the input drive voltage supplying section 40 generates a first input drive voltage obtained by superimposing a first prescribed voltage onto the reference voltage VHset and a second input drive voltage obtained by superimposing a second prescribed voltage onto the reference voltage VLset. The first prescribed voltage may be greater than a threshold voltage between the source terminal and the drain terminal of the transistor 30, which is the voltage necessary for conduction therebetween. The second prescribed voltage may be greater than or equal to 0. The first and second prescribed voltages may be variable voltages.

The input drive voltage supplying section 40 generates the input drive voltage based on the reference voltage VHset. Accordingly, the input drive voltage supplying section 40 can track the reference voltage VHset and change the input drive voltage accordingly. As a result, the driver circuit 200 can maintain a constant voltage between the source terminal and the gate terminal of the transistor 30, regardless of the reference voltage VHset.

The input gate drive section 42 selects either the first input drive voltage or the second input drive voltage, according to the input pattern PAT. For example, when the input pattern PAT has a logic value of 1, the input gate drive section 42 selects the first input drive voltage and supplies this voltage to the gate terminal of the transistor 30. When the input pattern PAT has a logic value of 0, the input gate drive section 42 may select the second input drive voltage and supply this voltage to the gate terminal of the transistor 30. The emphasized component generating section 26 may superimpose the emphasized component onto the voltage output by the input gate drive section 42.

For example, when the input gate drive section 42 selects the first input drive voltage, the emphasized component generating section 26 superimposes the emphasized component onto the input drive voltage, and when the input gate drive section 42 selects the second input drive voltage, the emphasized component generating section 26 does not superimpose the emphasized component onto the input drive voltage. By not superimposing the emphasized component when the second input drive voltage is selected, the emphasized component generating section 26 can set the voltage supplied to the gate terminal of the transistor 30 to be sufficiently lower than the threshold voltage between the gate terminal and the source terminal.

Figure 7:
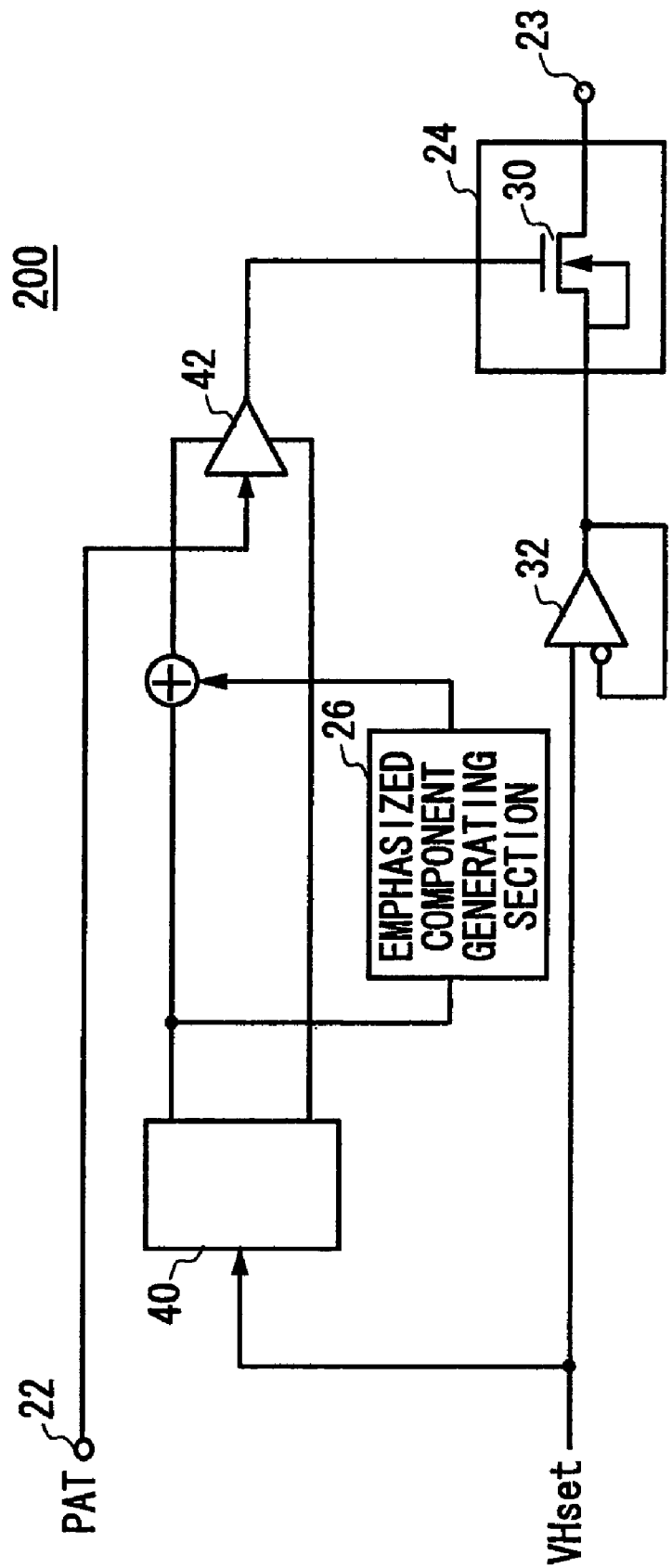
FIG. 7 shows a configuration of the driver circuit 200 according to a sixth embodiment.

FIG. 7 shows a configuration of the driver circuit 200 according to a sixth embodiment. In the present embodiment, the emphasized component generating section 26 superimposes the emphasized component onto the input drive voltage output by the input drive voltage supplying section 40. For example, the emphasized component generating section 26 may superimpose the emphasized component onto the first input drive voltage. When the emphasized component is superimposed onto the first input drive voltage, if the input pattern PAT has a logic value of 1, the input gate drive section 42 supplies the voltage onto which the emphasized component was superimposed to the gate terminal of the transistor 30. As a result, the driver circuit 200 can raise the voltage of the output signal at timings at which the logic value of the input pattern PAT changes to 1. In the same way, in the driver circuit 210, the emphasized component generating section 126 may superimpose the emphasized component onto the input drive voltage output by the input drive voltage supplying section.

Figure 8:
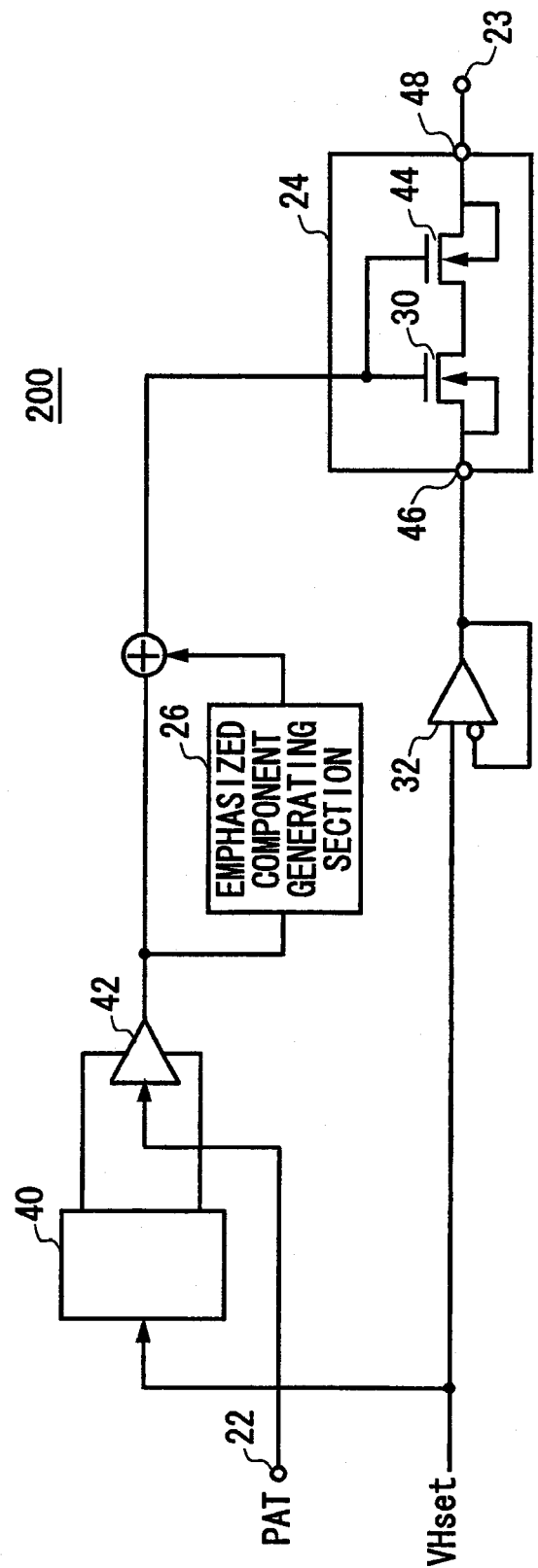
FIG. 8 shows a configuration of the driver circuit 200 according to a seventh embodiment.

FIG. 8 shows a configuration of the driver circuit 200 according to a seventh embodiment. In the present embodiment, the switching section 24 includes a plurality of transistors in a cascade connection between the voltage input terminal 46 to which the reference voltage is applied and the output terminal 48 that outputs the output signal. The transistor from among the plurality of transistors that is closest to the voltage input terminal 46, i.e. the transistor 30, has the source terminal and the substrate terminal thereof connected to the voltage input terminal 46. The transistor closest to the output terminal 48, i.e. the transistor 44, has the source terminal and the substrate terminal thereof connected to the output terminal 48. In the same way, in the driver 210, the switching section 124 may include a plurality of transistors in a cascade connection.

The source terminal of the transistor 30 may function as the voltage input terminal 46. The source terminal of the transistor 44 may function as the output terminal 48. The switching section 24 may include three or more transistors in a cascade connection.

In a MOS transistor, even when the transistor is OFF, a leak current flows in a direction from the source terminal to the drain terminal. In the present embodiment, the drain terminals of two transistors are connected to each other, so that each transistor prevents the leak current from flowing in the other transistor. As a result, leak current barely flows in any direction in the transistors in the cascade connection.

The transistor 30 and the transistor 44 may be NMOS transistors. NMOS transistors have lower surface area and capacitance than PMOS transistors having the same capabilities. Accordingly, the switching section 24 can achieve high-speed switching by using NMOS transistors for the transistor 30 and the transistor 44.

Figure 9:
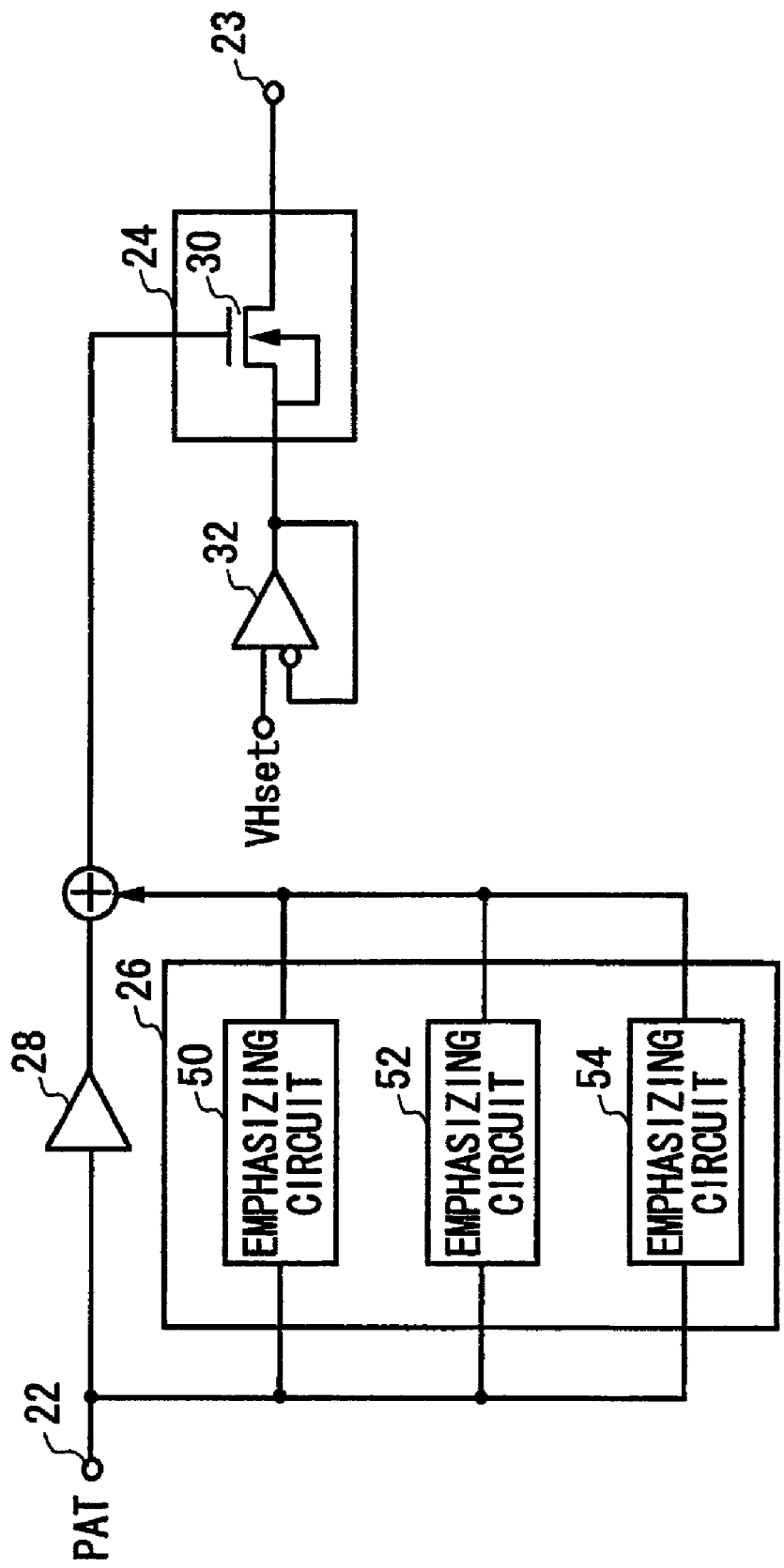
FIG. 9 shows a configuration of the driver circuit 200 according to an eighth embodiment.

FIG. 9 shows a configuration of the driver circuit 200 according to an eighth embodiment. In the present embodiment, the emphasized component generating section 26 includes a plurality of emphasizing circuits that receive different time constants and generate emphasized components in bands according to the received time constants. For example, the emphasized component generating section 26 includes three emphasizing circuits: an emphasizing circuit 50, an emphasizing circuit 52, and an emphasizing circuit 54. The emphasized component generating section 26 combines the emphasized components generated respectively by the emphasizing circuits and superimposes the resulting emphasized component onto the voltage supplied to the switching section 24.

The emphasized component generating section 26 can change the time constant of the emphasized component superimposed onto the output signal of the driver circuit 200 by combining the emphasized components of bands corresponding to different time constants and superimposing the resulting emphasized component onto the voltage supplied to the switching section 24. Accordingly, even if the waveform rounding differs according to the characteristic of the transmission line 400, the driver circuit 200 can superimpose, onto the output signal, an emphasized component having a time constant corresponding to the characteristic of the transmission line 400. As a result, the driver circuit 200 can output a waveform without rounding to the device under test 500, regardless of the characteristic of the transmission line 400. In the same way, in the driver circuit 210, the emphasized component generating section 126 may include a plurality of emphasizing circuits that receive different time constants and generate emphasized components in bands according to the received time constants.

Figure 10:
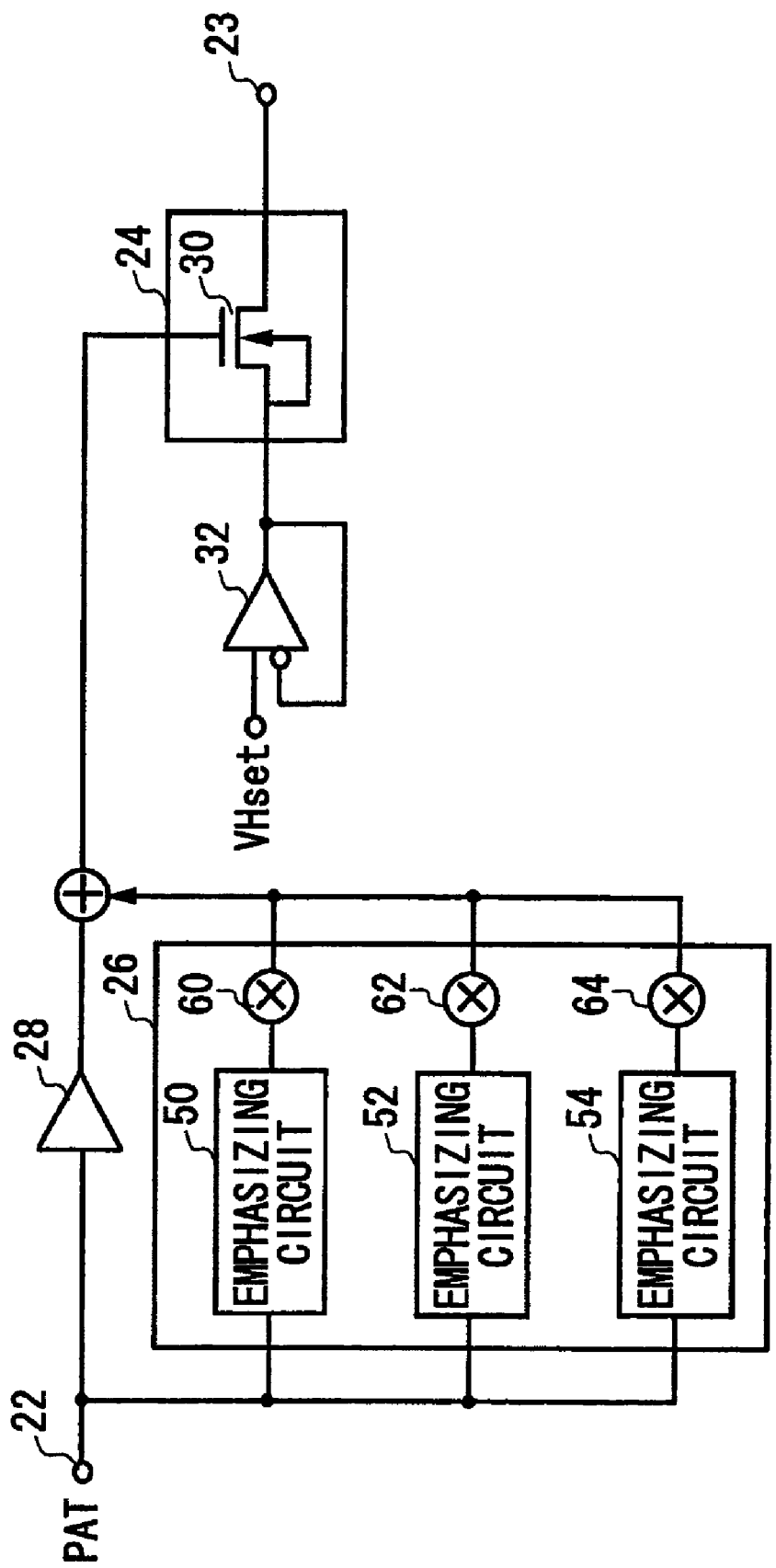
FIG. 10 shows a configuration of the driver circuit 200 according to a ninth embodiment.

FIG. 10 shows a configuration of the driver circuit 200 according to a ninth embodiment. In the present embodiment, the emphasized component generating section 26 further includes a plurality of multipliers that each multiply (i) the emphasized component output by the corresponding emphasizing circuit by (ii) a prescribed coefficient. In the same way, in the driver circuit 210, the emphasized component generating section 126 may include a plurality of multipliers that each multiply (i) the emphasized component output by the corresponding emphasizing circuit by (ii) a prescribed coefficient.

For example, the multiplier 60 may multiply the emphasized component output by the emphasizing circuit 50 by a first coefficient corresponding to an amplitude ratio by which the voltage of the emphasized component is amplified. The multiplier 62 may multiply the emphasized component output by the emphasizing circuit 52 by a second coefficient corresponding to an amplitude ratio by which the voltage of the emphasized component is amplified. The multiplier 64 may multiply the emphasized component output by the emphasizing circuit 54 by a third coefficient corresponding to an amplitude ratio by which the voltage of the emphasized component is amplified. Each amplitude coefficient may be the same value, or may be a different value. Each coefficient may be variable.

By including the plurality of multipliers corresponding respectively to the emphasizing circuits, the emphasized component generating section 26 can increase the variable range of the voltage that is superimposed on the voltage supplied to the switching section 24. As a result, the driver circuit 200 can output a waveform adapted to the characteristic of the transmission line 400, without increasing the number of emphasizing circuits.

Figure 11:
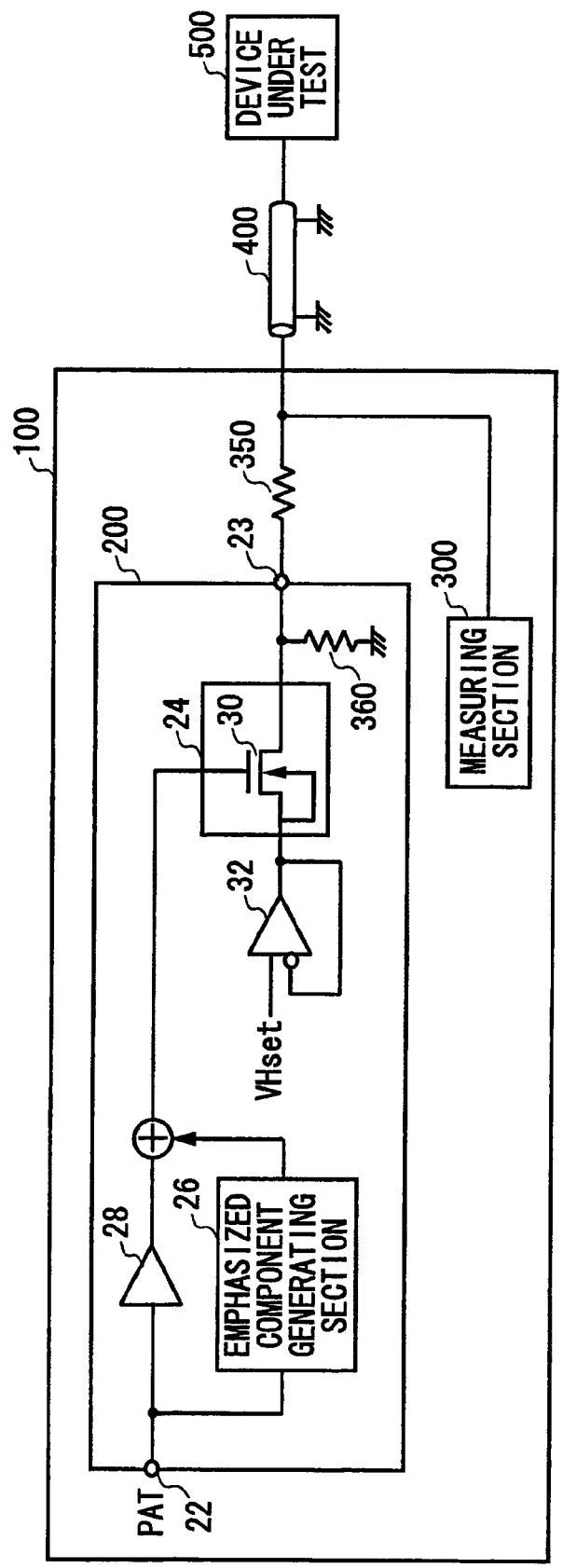
FIG. 11 shows a configuration of the test apparatus 100 according to a tenth embodiment.

FIG. 11 shows a configuration of the test apparatus 100 according to a tenth embodiment. In the above embodiments, the test apparatus 100 includes a plurality of driver circuits 200. However, the test apparatus 100 may instead include one driver circuit 200. The driver circuit 200 may include a pull-down resistor 360 connected between the output terminal 23 and the switching section 24.

When the input pattern PAT has a logic value of 1, the driver circuit 200 may output the reference voltage VHset from the output terminal 23. When the input pattern PAT has a logic value of 0, the driver circuit 200 may output a ground voltage via the pull-down resistor 360.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus and a driver circuit that can emphasize a high-band of an output signal to ensure impedance matching with a transmission line.

What is claimed is:

1. A test apparatus that tests a device under test, comprising:
   a driver circuit that generates an output signal according to a prescribed input pattern and supplies the output signal to the device under test; and
   a measuring section that judges acceptability of the device under test by measuring a response signal output by the device under test, wherein the driver circuit includes:
   an input terminal that receives the input pattern;
   a switching section that operates according to a logic value of the input pattern to generate the output signal; and
   an emphasized component generating section that is provided between the input terminal and the switching section, and that (i) generates an emphasized component according to a prescribed high frequency component of the input pattern and (ii) superimposes the emphasized component onto a voltage supplied to the switching section.

2. The test apparatus according to claim 1, wherein
   the switching section includes a transistor having a source terminal to which is supplied a prescribed reference voltage, a drain terminal from which is output the output signal, and a gate terminal to which is supplied the input pattern.

3. The test apparatus according to claim 2, wherein
   the emphasized component generating section superimposes the emphasized component onto the input pattern that is supplied to the gate terminal of the transistor.

4. The test apparatus according to claim 3, wherein
the transistor is a CMOS transistor,
the driver circuit further includes:
- an n-type gate voltage output section that outputs, according to the input pattern, a voltage that is applied to a gate terminal of an n-type transistor of the CMOS transistor; and
- a p-type gate voltage output section that outputs, according to the input pattern, a voltage that is applied to a gate terminal of a p-type transistor of the CMOS transistor, and the emphasized component generating section superimposes the emphasized component onto the input pattern before the input pattern is supplied to the n-type gate voltage output section and the p-type gate voltage output section.

5. The test apparatus according to claim 2, wherein
the emphasized component generating section superimposes the emphasized component onto the reference voltage supplied to the source terminal of the transistor.

6. The test apparatus according to claim 5, wherein
the driver circuit further includes a voltage follower circuit that receives the reference voltage and applies a voltage corresponding to the reference voltage to the source terminal of the transistor, and
the emphasized component generating section superimposes the emphasized component onto either the reference voltage input to the voltage follower circuit or the voltage output by the voltage follower circuit.

7. The test apparatus according to claim 2, wherein the driver circuit further includes:
- an input gate drive section that selects one of a plurality of input drive voltages supplied thereto, according to the logic value of the input pattern, and supplies the selected input drive voltage to the gate terminal of the transistor; and
- an input drive voltage supplying section that generates the input drive voltages according to the reference voltage supplied to the source terminal of the transistor, and supplies the input drive voltages to the input gate drive section.

8. The test apparatus according to claim 7, wherein
the emphasized component generating section superimposes the emphasized component onto the voltage output by the input gate drive section.

9. The test apparatus according to claim 7, wherein
the emphasized component generating section superimposes the emphasized component onto the input drive voltage.

10. The test apparatus according to claim 7, wherein
the switching section includes a plurality of the transistors in a cascade connection between the voltage input terminal to which the reference voltage is applied and the output terminal that outputs the output signal.

11. The test apparatus according to claim 10, wherein
the plurality of transistors are NMOS transistors.

12. The test apparatus according to claim 11, wherein,
one of the plurality of transistors closest to the voltage input terminal has a source terminal and a substrate terminal that are connected to the voltage input terminal, and
one of the plurality of transistors closest to the output terminal has a source terminal and a substrate terminal that are connected to the output terminal.

13. The test apparatus according to claim 1, wherein
the emphasized component generating section (i) includes a plurality of emphasizing circuits that are each supplied with a different time constant and that each generate an emphasized component in a band corresponding to the supplied time constant, (ii) combines the emphasized components generated by the emphasizing circuits, and (iii) superimposes the resulting emphasized component onto the voltage supplied to the switching section.

14. The test apparatus according to claim 13, wherein
the emphasized component generating section further includes a plurality of multipliers that each multiply (i) an emphasized component output by a corresponding one of the emphasizing circuits by (ii) a prescribed coefficient.

15. A driver circuit that generates an output signal according to an input pattern, comprising:
- an input terminal that receives the input pattern;
- a switching section that operates according to a logic value of the input pattern to generate the output signal; and
- an emphasized component generating section that is provided between the input terminal and the switching section, and that (i) generates an emphasized component according to a prescribed high frequency component of the input pattern and (ii) superimposes the emphasized component onto a voltage supplied to the switching section.

* * * * *